(12) United States Patent
Sakaue

(10) Patent No.: US 9,015,548 B2
(45) Date of Patent: Apr. 21, 2015

(54) ERROR DETECTION CORRECTION METHOD AND SEMICONDUCTOR MEMORY APPARATUS

(75) Inventor: Kenji Sakaue, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 437 days.

(21) Appl. No.: 13/040,763

(22) Filed: Mar. 4, 2011

(65) Prior Publication Data

US 2012/0054580 A1 Mar. 1, 2012

(30) Foreign Application Priority Data

Aug. 30, 2010 (JP) .................. 2010-192697

(51) Int. Cl.
*H03M 13/00* (2006.01)
*H03M 13/11* (2006.01)
*H03M 13/29* (2006.01)
*H03M 13/09* (2006.01)

(52) U.S. Cl.
CPC .......... *H03M 13/6577* (2013.01); *H03M 13/09* (2013.01); *H03M 13/1117* (2013.01); *H03M 13/112* (2013.01); *H03M 13/2906* (2013.01)

(58) Field of Classification Search
CPC ............ H03M 13/09; H03M 13/1117; H03M 13/6577; H03M 13/2906; H03M 13/112
USPC .......................... 714/755, 786, 780, 763, 758
See application file for complete search history.

(56) References Cited

U.S. PATENT DOCUMENTS

| 7,802,164 | B2 | 9/2010 | Hong et al. | |
| 7,930,619 | B2 * | 4/2011 | Shin et al. | 714/790 |
| 8,151,162 | B2 * | 4/2012 | Kanaoka et al. | 714/755 |
| 2004/0098659 | A1 * | 5/2004 | Bjerke et al. | 714/776 |
| 2007/0022362 | A1 * | 1/2007 | Yue et al. | 714/790 |
| 2009/0158112 | A1 * | 6/2009 | Oh et al. | 714/752 |

FOREIGN PATENT DOCUMENTS

CN 1714512 A 12/2005

OTHER PUBLICATIONS

Chinese Office Action issued Oct. 8, 2013, in China Patent Application No. 201110066788.2 (with English translation).

* cited by examiner

*Primary Examiner* — Guy Lamarre
(74) *Attorney, Agent, or Firm* — Oblon, McClelland, Maier & Neustadt, L.L.P.

(57) ABSTRACT

In an error detection correction method of an embodiment, in decoding processing using a sum-product algorithm, which repeats processing of propagating reliability $\alpha$ from a check node set to correspond to a Tanner graph of a check matrix of a low density parity check code to a plurality of bit nodes connected to the check node, and processing of propagating reliability $\beta$ from a bit node to a plurality of check nodes connected to the bit node, the check node includes a parity of two bits or more.

16 Claims, 9 Drawing Sheets

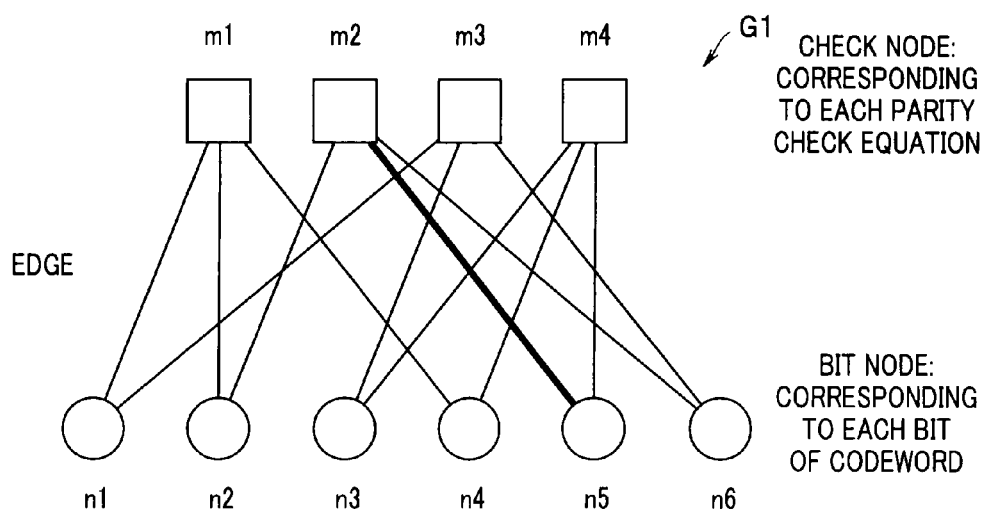

ERROR DETECTION CORRECTION METHOD AND SEMICONDUCTOR MEMORY APPARATUS

CROSS-REFERENCE TO RELATED APPLICATION

This application claims the benefit of Japanese Application No. 2010-192697 filed in Japan on Aug. 30, 2010, the contents of which are incorporated herein by this reference.

FIELD

Embodiments described herein relate generally to an error detection correction method using LDPC codes and a semiconductor memory apparatus which performs the error detection correction method.

BACKGROUND

For high density recording or the like in the storage field of semiconductor memories and the like, development related to digital data error correcting codes is underway. The error correcting codes can be roughly divided into an error correcting scheme based on an algebraic system and an error correcting scheme using iterative calculation based on probability. Low density parity check codes (hereinafter referred to as "LDPC codes") that belong to the latter are reported to have excellent performance nearing a Shannon limit. LDPC-coded data can be subjected to parallel processing with a relatively small circuit scale by using a sum-product algorithm.

Application of the LDPC codes to semiconductor memory apparatuses and the like has been advancing, and a more efficient error detection correction method is required.

BRIEF DESCRIPTION OF THE DRAWINGS

FIG. 1 is a diagram illustrating a check matrix H1;

FIG. 2 is a diagram illustrating a Tanner graph G1;

FIG. 9A illustrates transmission data, and FIG. 9B illustrates reception data;

FIG. 10A illustrates transmission data, and FIG. 10B illustrates reception data.

DETAILED DESCRIPTION

LDPC Code

Figure 3A:
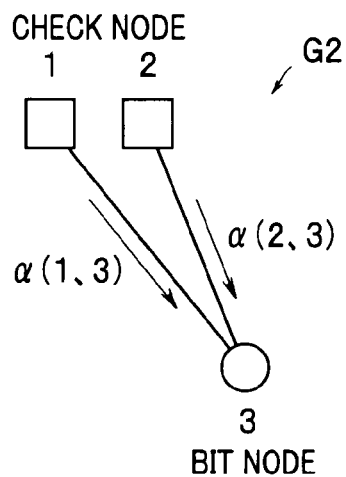
FIG. 3A to FIG. 3D are diagrams illustrating row processing and column processing in the case of a Tanner graph G2.
Figure 3B:
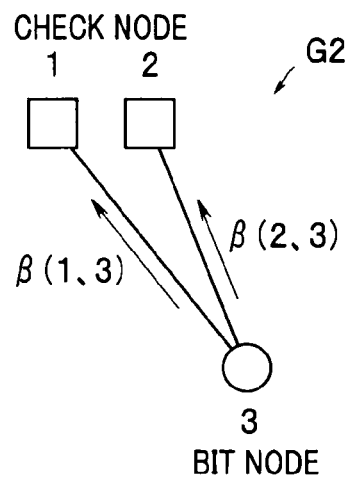

First, an LDPC code will be described. The LDPC code is a linear code defined by a very sparse check matrix, that is, a check matrix including a very few number of non-zero elements in the matrix and can be expressed by a Tanner graph. The error correcting processing corresponds to exchanging and updating results of local inferences between a bit node corresponding to each bit of a codeword and a check node corresponding to each parity check equation connected on a Tanner graph.

FIG. 1 illustrates a check matrix H1 with row weight wr=3 and column weight wc=2 in a (6, 2) LDPC code. The "(6, 2) LDPC code" is an LDPC code having a code length of 6 bits and an information length of two bits.

As shown in FIG. 2, when the check matrix H1 is expressed by a Tanner graph G1, the bit node corresponds to a column of a check matrix H and the check node corresponds to a row of the check matrix H. The Tanner graph G1 is configured by connecting nodes which are "1"s among elements of the check matrix H1 with edges. For example, "1" encircled on the second row and the fifth column of the check matrix H1 corresponds to an edge shown by a thick line of the Tanner graph G1. Row weight wr=3 of the check matrix H1 corresponds to the number of bit nodes connected to one check node, that is, the number of edges=3 and column weight wc=2 of the check matrix H corresponds to the number of check nodes connected to one bit node, that is, the number of edges=2.

The decoding processing using an LDPC code (hereinafter, also simply referred to as "LDPC") is performed by iteratively updating reliability (probability) information assigned to edges of the Tanner graph at the nodes. There are two types of reliability information; probability information from a check node to a bit node (hereinafter referred to as "external value" or "external information" and expressed by symbol "$\alpha$") and probability information from a bit node to a check node (hereinafter referred to as "a priori probability," "posteriori probability" or simply "probability," or "logarithmic likelihood ratio (LLR)" and expressed by symbol "$\beta$" or "$\lambda$"). Reliability update processing is made up of row processing and column processing and a unit in which row processing and column processing are performed one time each is called "one iteration (round) process" and decoding processing is performed by iterative processing which repeats iteration processing.

As described above, the external value $\alpha$ is probability information from a check node to a bit node during LDPC decoding processing and the probability $\beta$ is probability information from a bit node to a check node and these are terms known to those skilled in the art.

Hereinafter, row processing and column processing will be described using part of a Tanner graph G2 shown in FIG. 3A to FIG. 3D. First, bit node processing (column processing) will be described using FIG. 3A and FIG. 3B. Suppose a certain LLR which is an initial reliability of a codeword bit inputted corresponding to a certain bit node, for example, bit node 3 is $\lambda(3)$ and a probability from a check node to the bit node 3 is $\alpha(j, 3)$. Here, j denotes a check node number connected to the bit node 3.

The bit node 3 carries out a calculation expressed by the following (Equation 1) on a check node of an edge corresponding to α(1, 3), that is, a check node 1.

$$\beta(3,1)=\lambda(3)+\alpha(2,3) \quad \text{(Equation 1)}$$

Likewise, the bit node 3 carries out a calculation expressed by the following (Equation 2) on a check node of node number j.

$$\beta(3,j)=\lambda(3)+\Sigma\alpha(k,3) \quad \text{(Equation 2)}$$

Here, Σ means the sum total other than k=j among check nodes connected to the bit node 3.

The above described calculations are performed on all bit nodes and β(i, j) expressed by the following (Equation 3) is calculated. Here, assuming the code length is N and node number is i, i=1 to N. Furthermore, E means the sum total other than k=j among the check nodes connected to the bit node i.

$$\beta(i,j)=\lambda(i)+\Sigma\alpha(k,i) \quad \text{(Equation 3)}$$

Figure 3C:
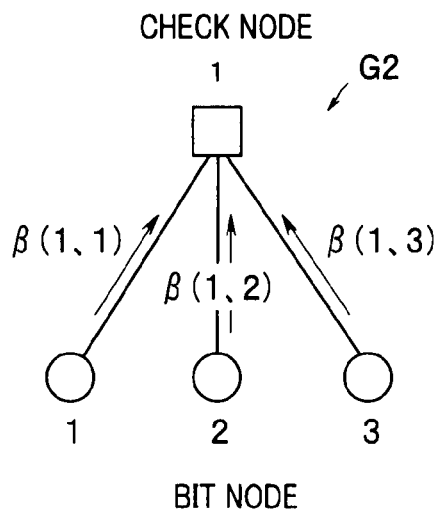

Next, check node processing (row processing) will be described using FIG. 3C and FIG. 3D. When external information which is a message to a certain check node, for example, the check node 1, is β(k, 1), this check node calculates α(1, 1) expressed by the following (Equation 4) on a bit node 1 which is a bit node of an edge corresponding to β(1, 1).

$$\alpha(1,1)=\text{sign}(\Pi\beta(m,1))\times\min(|\beta(m,1)|) \quad \text{(Equation 4)}$$

where, k is a bit node number connected to this check node 1. Here, m is selected from "2" and "3." Here, sign(Πβ(m, 1)) means sign ("+1" or "−1") of the result of multiplication of β(m, 1) by m=2 to 3. Furthermore, |β(m, 1)| is an absolute value of β(m, 1) and min is a function that selects a minimum value from among a plurality of |β(m, 1)|s.

Figure 3D:
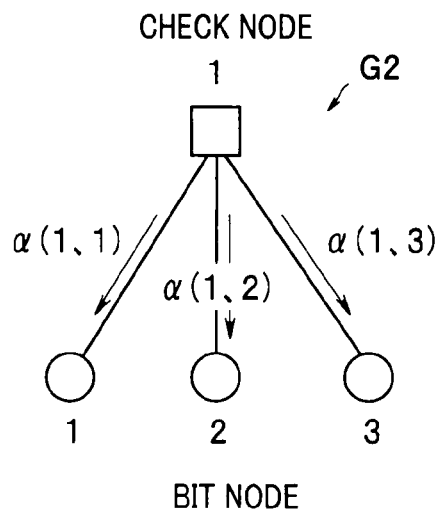

Likewise, α(1, i) will also be calculated using the following (Equation 5).

$$\alpha(1,i)=\text{sign}(\Pi\beta(m,1))\times\min\{|\beta(m,1)|\} \quad \text{(Equation 5)}$$

where, i is a bit node number connected to the check node 1 and is "1," "2" or "3" in the example of the Tanner graph in FIG. 3D. Furthermore, suppose m is any number other than m=i among the bit nodes connected to the check node 1.

The above described calculations are performed on all the check nodes and α(j, i) is calculated using the following (Equation 6).

$$\alpha(j,i)=\text{sign}(\Pi\beta(m,j))\times\min(|\beta(m,j)|) \quad \text{(Equation 6)}$$

where, suppose m is any number other than m=i among the bit nodes connected to the check node j.

In iterative decoding, posteriori probability Pb(i) is calculated using the following (Equation 7) for every one iteration process (one round) in which the above described bit node processing and check node processing are executed one time respectively.

$$Pb(i)=\lambda(i)+\Sigma\alpha(k,i) \quad \text{(Equation 7)}$$

where, i=1 to N, and N denotes a code length. Σ denotes the sum of all items connected to the bit node i.

Based on this posteriori probability value (temporary estimated word) Pb, a bit decision, that is, a hard decision is made as to whether the bit is "0" or "1." A final parity check of the LDPC code is performed using this hard decision result and the iterative processing ends upon confirming that there is no error. This is the iterative decoding method for the LDPC code.

As is already described, it is possible to perform decoding processing through parallel processing according to a reliability update algorithm at bit nodes and check nodes using a sum-product algorithm as a message transmission algorithm.

When the bit node connected to a check node passes parity check in LDPC, the reliability α of the bit node is increased, and when the bit node does not pass the parity check, the processing of reducing the reliability α is performed. Here, in the error detection correction method using the conventional LDPC codes, a parity bit is used for error detection in a check node. A parity bit is the simplest error detection code, is one bit CRC (CRC 1) which is a special case of cyclic redundancy check (CRC), and is generated from a polynomial (x+1).

With a parity bit, occurrence of an error can be detected when an odd-number of bits change. However, the error detection check using a parity bit includes only the ability of detecting an odd-number error of 1 or more. Therefore, if an even-number error of 2 or more occurs in a plurality of bit nodes connected to the same check node, the bit nodes erroneously pass parity check, and therefore, the parity check has the structural problem of being incapable of correctly updating reliability for bit nodes. Hereinafter, this phenomenon will be called "error row processing."

Due to error row processing, decoding processing time becomes long depending on the distribution pattern of errors of a plurality of bits in LDPC, and in the worst case, decoding processing does not converge. It is possible to enhance error detection precision in check nodes, that is, to suppress occurrence of error row processing, by increasing the check nodes by increasing the number of rows of the inspection matrix. However, if the number of rows of an inspection matrix is increased, the decoding time increases proportionally to this, and the capacity of the variable storing memory for check nodes increases.

First Embodiment

Hereinafter, an error detection correction method and a semiconductor memory apparatus according to a first embodiment of the present invention will be described. First, the configuration of a memory card 3 which is the semiconductor memory apparatus according to the first embodiment of the present invention will be described by using FIG. 4.

Figure 4:
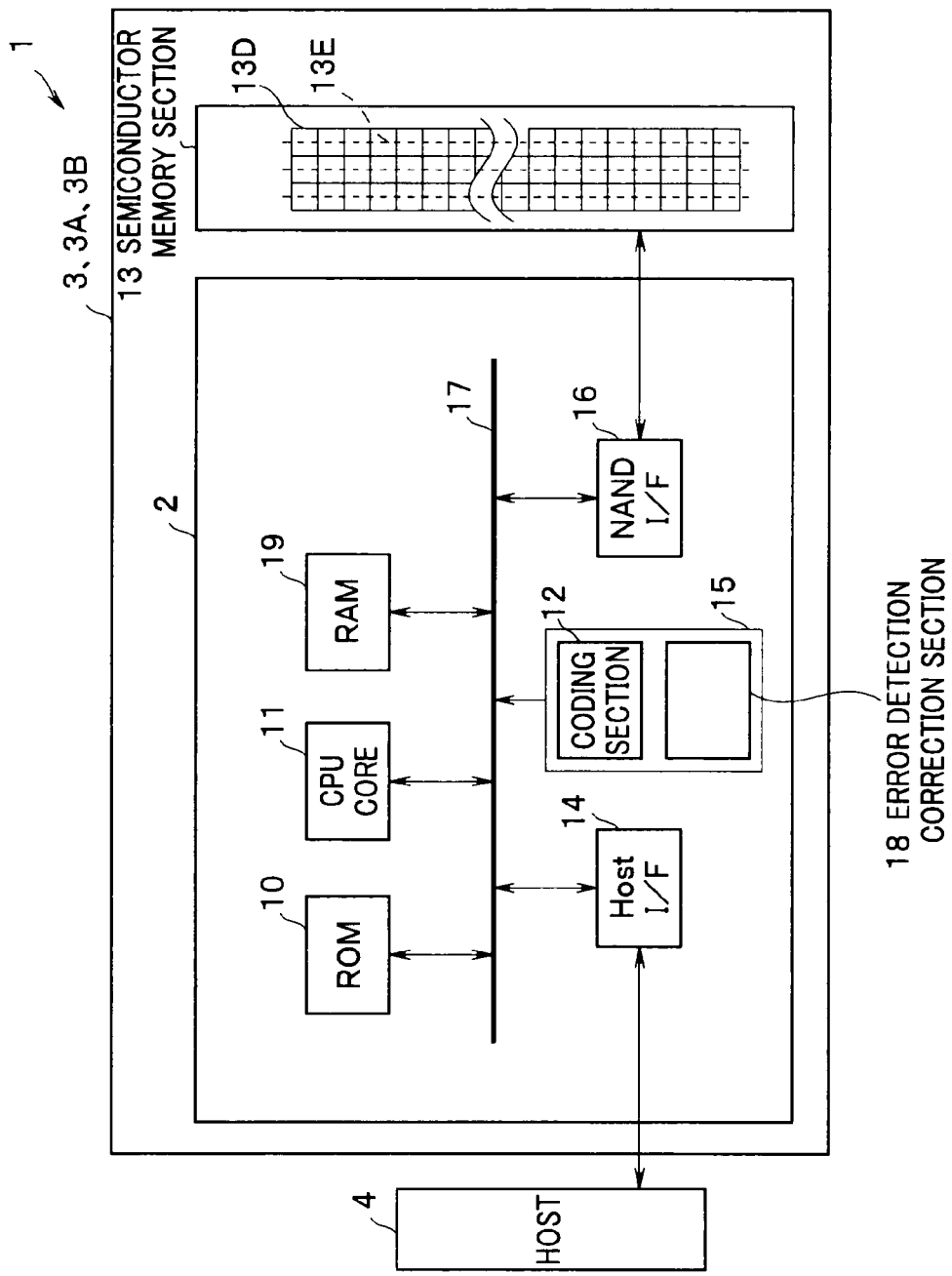
FIG. 4 is a configuration diagram of a semiconductor memory system according to a first embodiment.

As shown in FIG. 4, the memory card 3 is a storage medium configured to store data received from a host 4 such as a personal computer or digital camera and transmits the stored data to the host 4. The memory card 3 has a semiconductor memory section (hereinafter, simply referred to as "memory section") 13 and a memory controller 2 provided with an error detection correction section 15. The memory section 13 is made up of a NAND-type flash memory and has a structure in which many memory cells 13D, which are unit cells, are connected via bit lines 13E or the like. The semiconductor storage apparatus as the present embodiment may be a so-called embedded type storage apparatus which is housed inside a host and stores start data or the like of the host, or may be a mode of a semiconductor disk: SSD (Solid State Drive) or the like. Alternatively, the semiconductor memory apparatus and the host 4 may configure a memory system 1 such as an MP3 player which is a portable music player, for example.

The memory controller 2 includes a ROM 10, a CPU core 11, a RAM 19, a host I/F (interface) 14, the error correcting (ECC: Error Correcting Code) section 15 and a NAND I/F (interface) 16 connected via a bus 17.

The memory controller 2 transmits/receives data to/from the host 4 via the host I/F 14 using the CPU core 11 and transmits/receives data to/from the memory section 13 via the NAND I/F 16. Furthermore, the memory controller 2 realizes address management of the memory section 13 including restrictions on the number of rewrites through FW (firmware) executed by the CPU core 11. Moreover, control over the entire memory card 3 is also executed by FW according to a command input from the host 4. The ROM 10 stores a control program or the like of the memory card 3 and the RAM 19 stores an address conversion table or the like necessary for address management.

The ECC section 15 includes a coder 12 configured to generate and add an error correcting code when storing data and an error detection correction section 18 configured to decode read coded data when reading data. The ECC section 15 of the present embodiment uses low density parity check codes which are error correcting codes subjected to decoding processing through probability-based iterative calculations.

More specifically, the ECC section 15 performs decoding processing using a sum-product algorithm which repeats processing of propagating the reliability $\alpha$ from a check node set to correspond to the Tanner graph of the check matrix of an LDPC code to a plurality of bit nodes connected to the check node, and processing of propagating the reliability $\beta$ from a bit node to a plurality of check nodes connected to the bit node.

Figure 5:
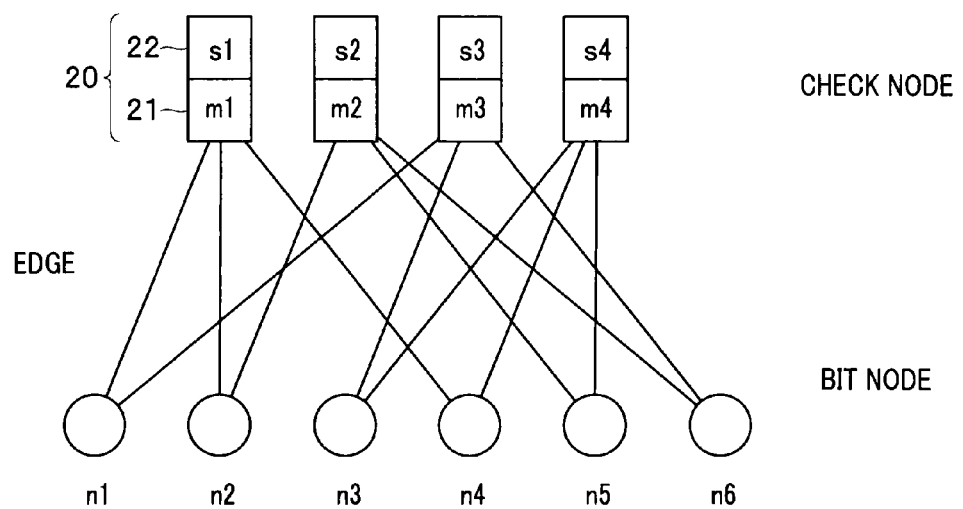
FIG. 5 is a diagram illustrating an auxiliary check node in an error detection correction method according to the first embodiment.

The ECC section 15 has a higher error detection ability of a check node than the error detection ability by a parity bit in the conventional error detection correction method. For example, as shown in FIG. 5, a check node 20 of the ECC section 15 includes an ordinary check node 21 configured to perform check using a parity bit, and an auxiliary check node 22 configured to perform check using a second parity differing from a parity bit.

More specifically, in the ECC section 15, each of the check nodes 20 has the auxiliary check node 22 having an error detecting function independent from the ordinary check node 21 in addition to the ordinary check node 21 having the error detecting function using a parity (first parity/parity bit/1-bit CRC/CRC 1) of the original LDPC. Hereinafter, the parity which is coded and generated for use in the auxiliary check node 22 will be referred to as an auxiliary parity (second parity).

Figure 6:
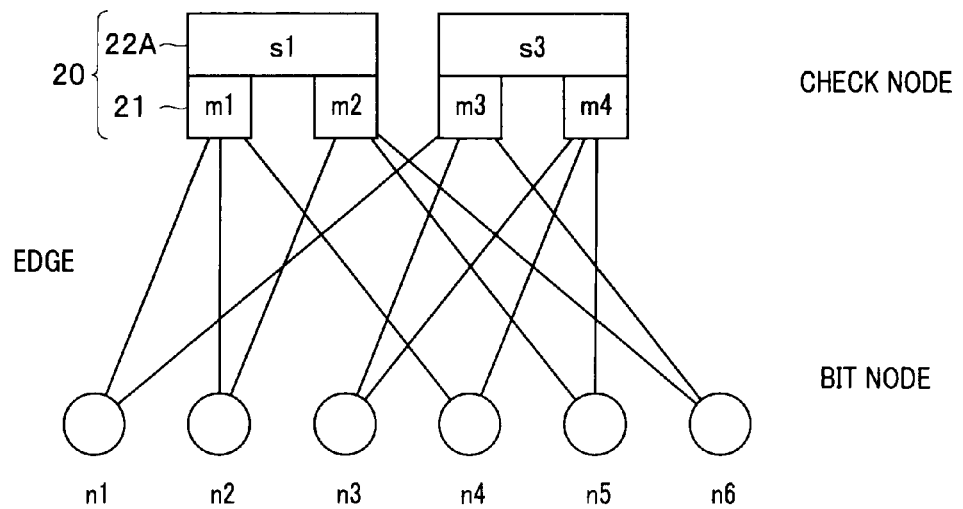
FIG. 6 is a diagram illustrating an auxiliary check node in an error detection correction method according to a modified example of the first embodiment.

It is preferable to have the auxiliary check node 22 with the second parity created for n (n is an integer of 2 or larger) of the ordinary check nodes 21 as one unit. It is preferable to have the auxiliary check node 22 with the second parity created for two of the ordinary check nodes 21 as one unit, for example, as in a modified example shown in FIG. 6.

The auxiliary parity may be included or does not have to be included in the coding range of LDPC, and inclusion of the auxiliary parity can be flexibly decided according to the configuration requirements of the system. In the following description, an auxiliary parity is included in the LDCP parity. As a result of including an auxiliary parity in the LDPC parity, even if the auxiliary parity itself makes an error, the error of the auxiliary parity bit can be corrected by the original decoding function of LDPC.

As is already described, parity check in the check node (ordinary check node) of the conventional LDPC uses a parity bit, and therefore, only an odd-number bit error of one bit or more can be detected. In contrast with this, the error detection correction method of the present embodiment has auxiliary coding (second parity) for complementing an ordinary LDPC parity (parity bit), and can detect an even-number error of two bits or more in some cases.

Furthermore, as the second parity, a code capable of not only error detection but also error correction may be used. The second parity can be selected from an ordinary coding scheme using, for example, CRC codes (CRC 2, 3, 4, 5, 6, 7, ... 32, ...) with the error detection bit number t=2 or larger, humming codes, BCH codes or RS codes with an error correction symbol number t=2 or larger, or the like.

As will be described later, when the second parity has an error correction ability, error correction processing can be performed in the check node in accordance with the check result of the auxiliary check node 22.

Figure 7:
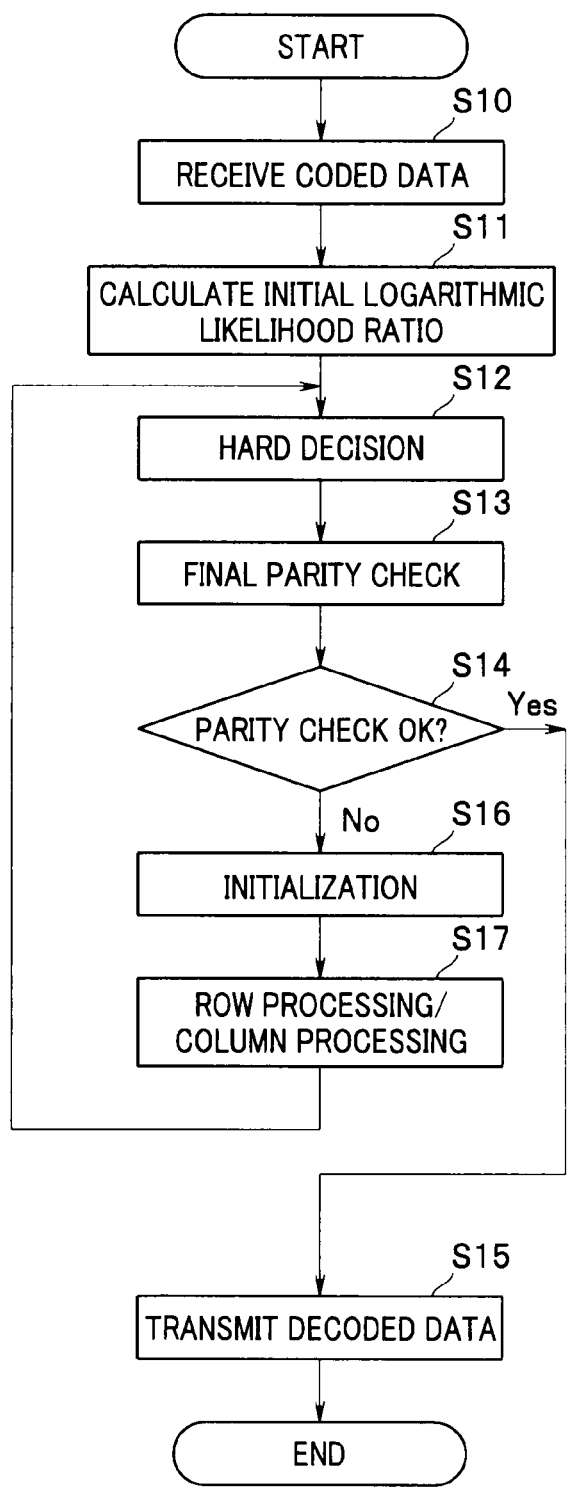
FIG. 7 is a flowchart illustrating a flow of decoding processing in the error detection correction method according to the first embodiment.

Next, an operation flow of the ECC section 15 using the error detection correction method of the present embodiment will be described using FIG. 7.

<Step S10> Data Reception

The error detection correction section 18 of the ECC section 15 receives coded data stored in the memory section 13 via the NAND I/F 16.

<Step S11> Initial LLR Value Reception

The initial LLR calculation section (not illustrated) of the error detection correction section 18 calculates an initial LLR (a priori probability 13) from the coded data based on a likelihood ratio table or the like stored in the ROM 10 or the like.

<Step S12> Hard Decision

A hard decision is made based on the LLR and a temporary estimated word is generated.

<Step S13> Final Parity Check

The error detection correction section 18 makes a final parity check using the temporary estimated word.

<Step S14> Final Parity Check OK?

When the final parity check result confirms no error (Yes), the error detection correction section 18 outputs decoded data to the host 4 via the host I/F 14 in step S15 and the processing ends.

<Step S16> Initialization

When the final parity check result shows an error (S14: No), the error detection correction section 18 starts iteration processing based on the initial LLR.

<Step S17> Check Node Processing (Row Processing)/Bit Node Processing (Column Processing)

A priori probability $\beta$ is transmitted to the connected check node from the bit node and the check node calculates a product of the received probabilities and transmits the product to the connected bit node as external information (reliability) $\alpha$.

At the check node, the external information $\alpha$ is transmitted to the connected bit node, the bit node calculates a product of the received probabilities and transmits the product to the connected check node as a posteriori probability $\beta$.

When one-round processing is completed, hard decision processing is performed in step S12, and further a final parity check is made in step S13 and the processing is completed when the result is OK. When the result is NG, the processing from step S16 is repeatedly performed.

Here, check node processing in the case of adoption of CRC in an auxiliary coding scheme in an auxiliary check node will be described. CRCt means a t-bit CRC. Assuming the priori/posteriori probability is $\beta$, and external information is $\alpha$, a value M to be added or subtracted to or from $\alpha$ is changed based on the results of both an LDPC parity (first parity) and an auxiliary parity (second parity).

More specifically, in accordance with the check results of an ordinary check node and an auxiliary check node, the reliability $\alpha$ to be propagated to a plurality of connected bit nodes is increase or decreased.

As is already described, in the conventional LDCP, the value M added or subtracted to or from $\alpha$ is fixed to an absolute value $|\beta m|$ of a $\beta$minimum value ($\beta m$). In contrast with this, in the LDPC of the present embodiment (modified example), M is decided as described as follows.

In the case of the embodiment (n=1), $\alpha$ is updated by directly using the auxiliary parity decision result.

In the case of the modified example (n>1), the reliability of the auxiliary parity decision result is reduced as compared with the case of n=1, and therefore, α is updated in accordance with the reliability.

Hereinafter, a decision example of the M value in the case of simultaneously executing an LDPC parity check and an auxiliary parity check (CRC check) in row processing will be shown.

CRC, n=1 (Embodiment)>

(Case 1) LDPC Parity (First Parity) OK, Auxiliary Parity (Second Parity) OK

→M=H×|βm| is added to |β|. H represents a correction coefficient, and changes the value in response to the precision of the auxiliary parity. For example, in the case of CRC 3, H=2.0, and in the case of CRC 4, H=3.0. More specifically, the reliability α is increased.

(Case 2) LDPC Parity OK, Auxiliary Parity NG

→M=|βm| is added to |α|. The cause of auxiliary parity NG is unlikely to be the check target bits, and therefore, the same processing as in the conventional LDPC is performed.

(Case 3) LDPC Parity NG

→M=|βm| is subtracted from |α|. More specifically, the reliability α is decreased.

As an option (modified example), when the detection precision of the auxiliary parity is enhanced, for example, in the case of the auxiliary parity of four bits or more, the reliability |α| of the bit nodes connected to the check node passing the check may be uniformly set to the maximum value.

CRC, n>1 (Modified Example)>

(Case 1) LDPC Parity OK, Auxiliary Parity OK

→M=|βm| is added to |α|. More specifically, the reliability α is increased. H represents a correction coefficient, and is decided in accordance with the precision of the auxiliary parity and n. For example, in the case of n=2 and CRC 3, H=1.6, in the case of n=2 and CRC 4, H=1.8, in the case of n=3 and CRC 3, H=1.2, and in the case of n=3 and CRC 4, H=1.4.

(Case 2) LDPC Parity OK, Auxiliary Parity NG

→M=|βm| is added to |α|. More specifically, the cause of auxiliary parity NG is unlikely to be the check target bits, and therefore, the same processing as in the conventional method is applied.

(Case 3) LDPC Parity NG

→M=|βm| is subtracted from |α|. More specifically, the reliability α is decreased.

When the number t of error-detectable bits of CRC is increased, and n=1 (an auxiliary parity is added to every row), the probability of occurrence of error row processing is reduced, and therefore, the disadvantage of the conventional LDPC can be significantly overcome. Instead, the number of bits of the auxiliary parity increases, and the effective coding rate is reduced. For example, the ratio of the parity to the data in the page of a NAND flash memory increases. Therefore, n and t are decided in view of the trade-off relationship between reinforcement of the correction ability and the effective coding rate.

When auxiliary coding is performed using a code (a humming code, a BCH code, an RS code or the like) including an error correcting function, not only the error detecting function, but also the error correction function may be used. In the case of using only the error detecting function, processing can be performed similarly to a CRC parity. For example, when auxiliary coding is carried out using a BCH code, error correction processing of BCH may be executed while being linked with the decoding processing of LDPC to assist in the error correction processing of LDPC. For example, in the mounting state in which parallel processing of the error correction processing of BCH and the error correction of LDPC is performed, after success of the error correction of BCH, LDPC decoding target data is updated to the data corrected in BCH at a timing at which mismatching does not occur in the LDPC processing (for example, at the time of end of one round processing when one row processing/column processing of LDPC ends).

As in the above description, the LDPC error detection correction method according to the embodiment in which the check node has a parity of two bits or more which has a higher error detection ability than a parity bit is effective since the method has a low occurrence of error row processing. That is to say, the error detection correction method according to the present embodiment having auxiliary check nodes in addition to the ordinary check nodes, in which the check node processing has a parity of two bits or more can reduce the error matrix processing occurrence probability.

Further, when the auxiliary check node has a parity of two bits or more, for example, when the auxiliary check node has a strong auxiliary parity of four bits or more, the reliability of the bit nodes connected to the auxiliary check node which has passed auxiliary parity check is uniformly set at the maximum value, whereby the decoding time is further shortened and the efficiency can be enhanced. The number of bits of the check node is preferably 1024 bits or less, for example, since if the number of bits increases, the coding rate is reduced.

As described above, in the ECC section using an LDPC code according to the present embodiment, the auxiliary check node 22 is provided for every n (n is an integer which is 1 or larger, and is preferably 2 or larger) check nodes, the auxiliary check node 22 includes the t symbol (t=an integer which is 2 or larger) error detecting function for the bit nodes connected to n of check nodes, and the calculation processing content of LDPC is changed in accordance with the parity check result of the auxiliary check node 22. More specifically, the check node 20 is allowed to have the parity of two bits or more, and thereby, the probability of performing error row processing because even number error detection of two bits or more cannot be made in the check node processing can be reduced.

The semiconductor memory apparatus using the error detection correction method of the present embodiment has a short decoding time and a compact circuit scale. The error detection correction method of the present embodiment includes an excellent correction ability with a low error row processing occurrence probability.

Second Embodiment

Next, an error detection correction method and a memory card 3A which is a semiconductor memory apparatus according to a second embodiment of the present invention will be described. The present embodiment is similar to the first embodiment. Therefore, the same components are assigned with the same reference signs, and the description thereof will be omitted.

In the auxiliary coding method according to the first embodiment, increase in the auxiliary parity size is suppressed by increasing the number n of check nodes which is the unit for addition of the auxiliary parity. However, the error detection reliability of the auxiliary parity becomes lower proportionally to n. In the special auxiliary coding scheme according to the present embodiment, the auxiliary parity according to the first embodiment is improved. More specifically, in the special auxiliary coding scheme according to the present embodiment using an improved auxiliary code, only a 1-bit parity of a special auxiliary code is added to each check node as an auxiliary parity, for example. However, an even-number error of two bits or more can be detected with a predetermined probability, and the occurrence of error row processing can be suppressed without significant reduction in the coding rate.

Figure 8:
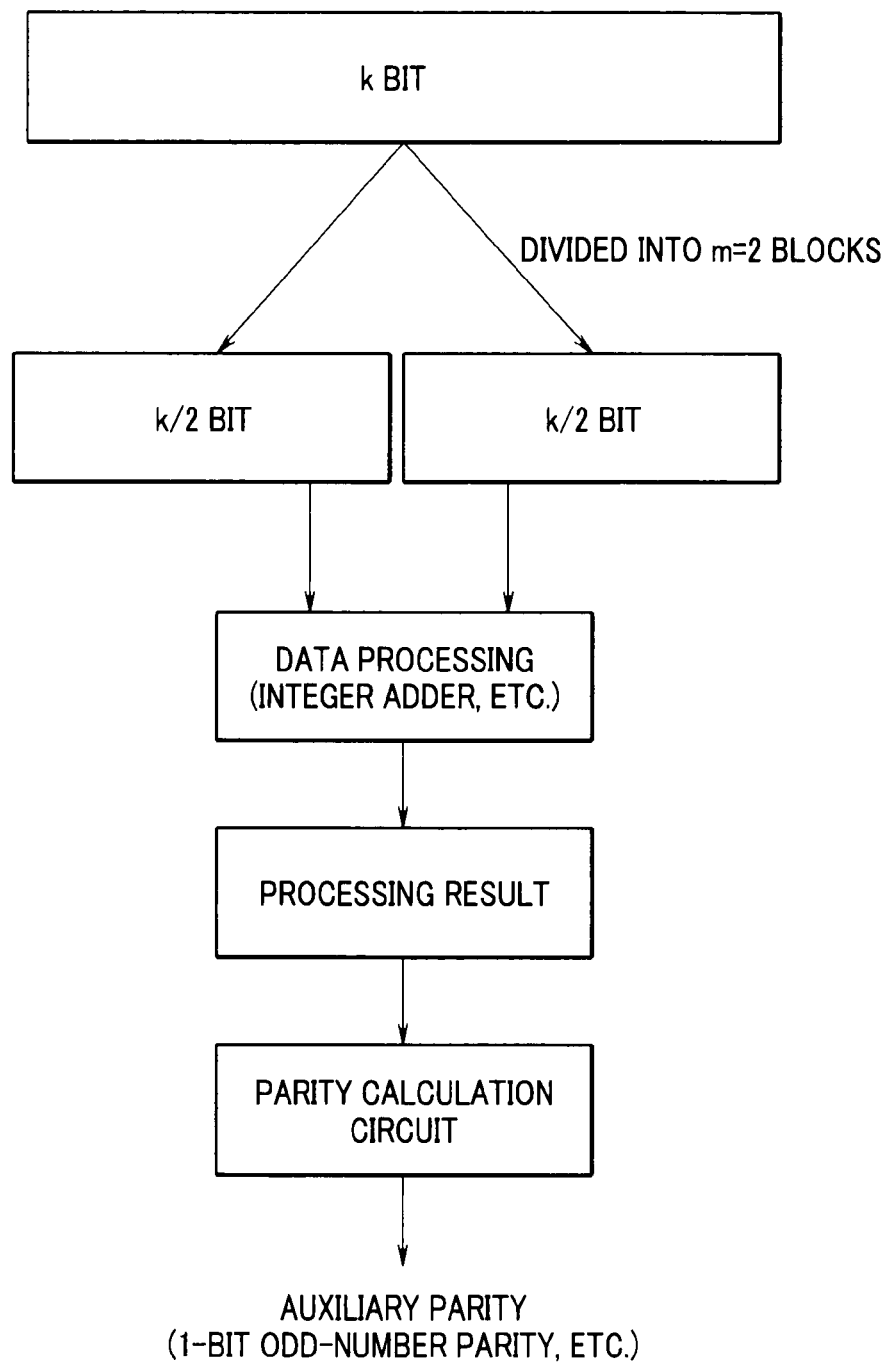
FIG. 8 is a diagram illustrating an auxiliary parity by block division in an error detection correction method according to a second embodiment.

As shown in FIG. 8, in the error detection correction method according to the present embodiment, a data set (data column) of k bits connected to a certain check node is divided into m blocks. The dividing method into blocks may be arbitrary. For example, in the case of m=2 and the data set of 32 bits, the data set is divided into high-order 16 bits and low-order 16 bits, or divided into even-numbered 16 bits and odd-numbered 16 bits.

Among m operands, operation/data processing (for example, addition, subtraction, multiplication, division, exponentiation, scramble, compression/decompression, encryption, a Galois field operation, the combination of them, or the like) is executed, for example, a 1-bit odd-number parity of the processing result is calculated, and this is set as an auxiliary parity (special auxiliary code).

During LDPC row processing, the auxiliary parity is recalculated, and it is confirmed whether the value of the recalculated auxiliary parity coincides with that of the received auxiliary parity. If they coincide with each other, the auxiliary parity OK is determined. According to the above mechanism, with use of only an auxiliary parity of one bit, an even-number error of two bits or more can be detected with a predetermined probability as will be described later.

For example, a carry occurs in addition processing, and therefore, a change due to a certain bit error may have an influence on the other plurality of high-order bits. More specifically, the phenomenon may occur, in which the number of "1"s of the calculation result in the situation without an error, and the number of "1"s in the calculation result with an even-number error of two bits or more differ from each other. Therefore, an error of two bits or more can be detected by a parity of one bit.

However, the auxiliary parity result does not always change due to an even-number error of two bits or more, and therefore, this mechanism includes only the function of reducing the probability of erroneous determination of an even-number error of two bits or more in a check node.

Hereinafter, the description will be made in a concrete manner. Here, suppose k=8 bits, the data column connected to a certain check node is D. The data column is divided into m=2, and is dealt as two pieces of numeric data, and addition processing of two operands is executed. At this time, a carry-out of the highest-order bit may be included in an odd-number parity calculation, but is not included in the following description.

D="0000_0101"
D2="0000," D1="0101,"
D1+D2="0000"+"0101"="0101,"

Here, auxiliary parity=odd-number parity="0" (if the number of bits "1" is an odd-number, the odd-number parity="1"). Suppose a two-bit error occurs to reception data R of D, and R="0100_0111," r1="0111," and r2="0100." Thereupon, r1+r2="0111"+"0100"="1011." Since the number of "1"s is an odd number, the auxiliary parity becomes "1" when recalculated, and differs from the received auxiliary parity="0," and therefore, a two-bit error can be detected.

More specifically, the conventional LDPC parity check (ordinary check node) using a parity bit (1-bit CRC) makes erroneous decision when an even-number error of two bits or more occurs. In contrast with this, the auxiliary parity (special auxiliary code) of the present embodiment cannot detect an even-number error of two bits or more by 100%, but can detect the even-number error of two bits or more depending on the location of an error bit. Therefore, by carrying out special auxiliary coding, the error decision probability of the LDPC parity, that is, the probability of occurrence of error row processing can be reduced.

Influence on the auxiliary parity bit to a bit error phenomenon may change in accordance with the number m of divisions of a data set, and therefore, m is set at a suitable value which makes the influence large. For example, when an auxiliary parity is generated by addition processing as described above, if m is made large, the addition occurrence probability of "1"s increases, and carry propagation easily occurs. Therefore, m is desirably made large.

Here, for example, when the number of bit nodes connected to one check node is about 40 bits, m is made m=4, four of 10-bit data are generated, and the auxiliary parity is calculated based on the addition result by using four operands. Furthermore, when an even-number bit error is more easily detected when a carry-out is included in the auxiliary parity calculation, the carry-out may be included.

A calculation content is selected in accordance with the characteristics of data. Further, a plurality of kinds of calculations, or data processing may be combined. For example, when data has a number of patterns of continuing "0"s or "1"s, it is preferable to convert the patterns into a data pattern including many toggle patterns "1010 . . . " by applying scramble frequently used in the communication technology to the data, and thereafter, execute addition or subtraction to create a situation in which a carry/borrow easily occurs intentionally.

In the first embodiment already described, even when CRC 2 which makes the auxiliary parity size the minimum with n=1 in ordinary auxiliary coding is adopted, an auxiliary parity of two bits (second parity) is required. However, in the error detection correction method according to the present embodiment, the auxiliary parity (second parity) has one bit according to the special coding scheme, and therefore, substantial coding rate reduction can be suppressed to the minimum as compared with ordinary auxiliary coding.

Update of α corresponding to a parity decision result in a check node is performed as follows, for example.

<In the Case of n=1>
(Case 1) LDPC Parity (First Parity) OK, Auxiliary Parity (Second Parity) OK
→M=|βm| is added to |α|. H represents a correction coefficient, and, for example, H=1.5. More specifically, the reliability α is increased.
(Case 2) LDPC Parity OK, Auxiliary Parity NG
→M=|βm| is added to |α|. The cause of auxiliary parity NG is unlikely to be the check target bits, and therefore, the same processing as in the conventional method is applied.
(Case 3) LDPC Parity NG
→M=|βm| is subtracted from |α|. More specifically, the reliability α is decreased.

Here, also in the special auxiliary coding of the error detection correction method according to the present embodiment, n is set to n=2 or more, and the effective coding rate reduction can be further reduced. More specifically, the data of the check node 1 is set as D1, and the data of the check node 2 is set as D2, "D1+D2" is calculated, an odd-parity of the calculation result is calculated, and the odd-parity is set as an auxiliary parity bit.

When n=2 is set, and the auxiliary parity is calculated on the data set belonging to two check nodes, (the number of all check nodes×½) of auxiliary parities are added. For n, an arbitrary integer value of two or more can be selected. The value of n is decided with trade-off of the correction ability and the effective coding rate.

<In the Case of n>2>

(Case 1) LDPC Parity OK, Auxiliary Parity OK
→M=|βm| is added to |α|. More specifically, the reliability α is increased. H represents a correction coefficient, and is decided in accordance with n. For example, when n=2, H=1.4, and when n=3, H=1.2.

(Case 2) LDPC Parity OK, Auxiliary Parity NG
→M=|βm| is added to |α|. The cause of auxiliary parity NG is unlikely to be the check target bits, and therefore, the same processing as in the conventional method is applied.

(Case 3) LDPC Parity NG
→M=|βm| subtracted from |α|. More specifically, the reliability α is decreased.

As described above, in the error detection correction method according to the present embodiment, the second parity is a 1-bit parity of the special auxiliary code created by dividing a data column into a plurality of divided data columns, and performing operation processing among 1-bit data configuring the divided data columns. In particular, the operation processing is at least any one of addition processing, subtraction processing, multiplication processing, division processing, exponentiation processing, scramble processing, compression processing, decompression processing, encryption processing and Galois field operation processing.

Third Embodiment

Next, an error detection correction method and a memory card 3B which is a semiconductor memory apparatus according to a third embodiment of the present invention will be described. Since the present embodiment is similar to the second embodiment and the like, the same components are assigned with the same reference signs, and description thereof will be omitted.

An ordinary parity bit used by an ordinary check node, that is, 1-bit CRC is created by sequentially performing an exclusive OR (EOR) operation on 1-bit data Dn which configures n-bit data column D. In exclusive OR: EOR, "1" is outputted when data differ.

Figure 9A:
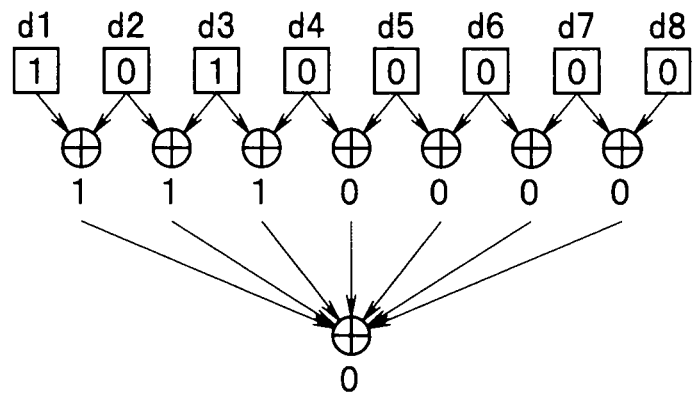
FIG. 9A and FIG. 9B are diagrams illustrating parity bits of normal check nodes in an error detection correction method according to a third embodiment.
Figure 9B:
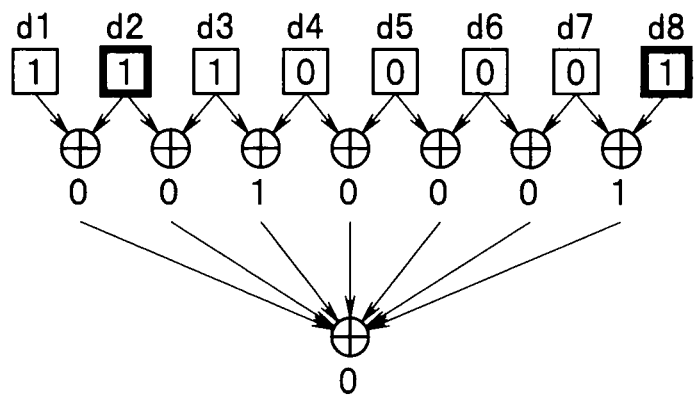

FIG. 9A and FIG. 9B illustrates an ordinary parity bit creating method with k=8 and a data column connected to a certain check node being D, that is, a data column made up of eight of 1-bit data, D=0000_0101 (d1=1, d2=0, d3=1, d4=0, d5=0, d6=0, d7=0, d8=0) used as an example.

In contrast with this, in the error detection correction method of the present embodiment, an auxiliary bit (second parity) is a 1-bit parity created by alternately performing an exclusive OR (XOR or EOR) operation and a logical operation (Boolean operation) other than an EOR operation sequentially on 1-bit data configuring a data column.

Here, the logical operation other than an EOR operation is any one of a logical AND (AND) operation, a NOT-AND (NAND) operation, a logical OR (OR) operation, and a neither-nor (NOR) operation.

For example, the improved parity bits which are the second parities of the present embodiment are created by alternately performing an exclusive OR (EOR) operation, and a logical AND (AND) operation on 1-bit data do configuring a data column D of n bits. In a logical AND operation, "1" is outputted when data are both 1. In a logical OR operation, "1" is outputted if any one of the data is 1.

Figure 10A:
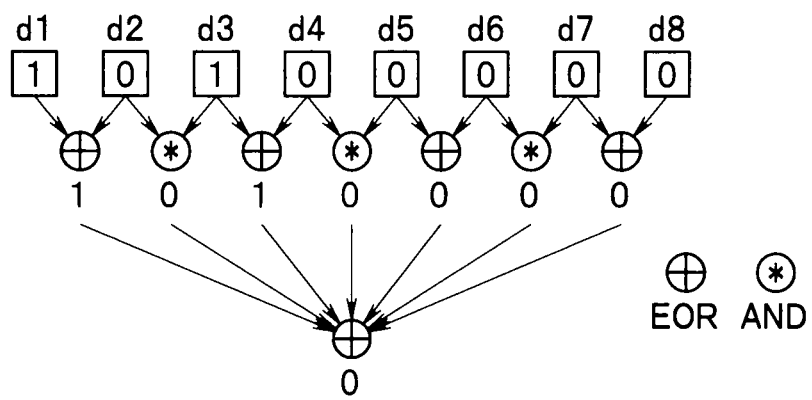
FIG. 10A and FIG. 10B are diagrams illustrating auxiliary parity bits of auxiliary check nodes in the error detection correction method according to the third embodiment.
Figure 10B:
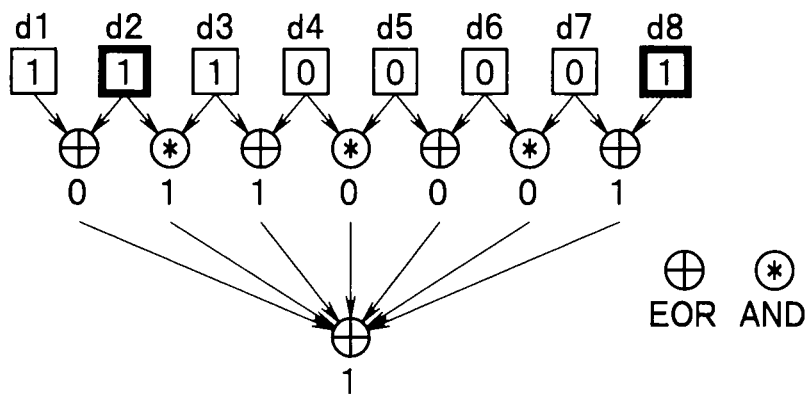

For example, as shown in FIG. 10A and FIG. 10B, k=8 bits is set, and a data column connected to a certain check node is set as D. This is divided into m=k=8, and is dealt as eight of 1-bit numeric data, and an EOR operation and an AND operation on the adjacent 1-bits are sequentially executed. More specifically, calculation is executed seven times in total. The odd-number parity of this result is calculated, and the calculated odd-number parity is set as an auxiliary parity.

D="0000_0101"
d1="1," d2="0," d3="1," d4="0," d5="0," d6="0," d7="0," d8="0," ("^" means an EOR operation, "*" means an AND operation)
(d1^d2)^
(d2*d3)^
(d3^d4)^
(d4*d5)^
(d5^d6)^
(d6*d7)^
(d7^d8)^="0," that is, in the above example, the auxiliary parity=odd-number parity="0."

In contrast with this, suppose a 2-bit error occurs to the reception data R of D, and R="1000_0111." Since the number of "1"s of the addition result is three and is an odd number, the auxiliary parity becomes "1" when the auxiliary parity (odd-number parity) is recalculated, and differs from the received auxiliary parity="0," and therefore, a two-bit error can be detected.

Here, description is further made using Table 1. Table 1(A) shows an auxiliary parity of transmission data. Table 1(B) shows an auxiliary parity of reception data to which an error occurs. Table 1(C) shows a 1-bit error detection probability. Table 1(D) shows a 2-bit error detection probability. Table 1 shows the case in which the data of d2 differs at the time of transmission and reception as an example.

TABLE 1

| (A) TRANSMISSION DATA | | | | | |
|---|---|---|---|---|---|
| d1 | d2 | d3 | a<br>EOR(d1, d2) | b<br>AND(d2, d3) | c<br>EOR(a, b) |
| 0 | 0 | 0 | 0 | 0 | 0 |
| 0 | 0 | 1 | 0 | 0 | 0 |
| 0 | 1 | 0 | 1 | 0 | 1 |
| 0 | 1 | 1 | 1 | 1 | 0 |
| 1 | 0 | 0 | 1 | 0 | 1 |
| 1 | 0 | 1 | 1 | 0 | 1 |

TABLE 1-continued

| 1 | 1 | 0 | 0 | 0 | 0 |
| 1 | 1 | 1 | 0 | 1 | 1 |

↓ (ERROR OCCURRENCE)

| | | | (B) RECEPTION DATA | | | | (C) DETECT 1 BIT ERROR 1 BIT ERROR |
|---|---|---|---|---|---|---|---|
| d1 | d2 | d3 | a EOR(d1, d2) | b AND(d2, d3) | c EOR(a, b) | | DETECTABLE OR UNDETECTABLE |
| 0 | 1 | 0 | 1 | 0 | 1 | → | ○ |
| 0 | 1 | 1 | 1 | 1 | 0 | → | X |
| 0 | 0 | 0 | 0 | 0 | 0 | → | ○ |
| 0 | 0 | 1 | 0 | 0 | 0 | → | X |
| 1 | 1 | 0 | 0 | 0 | 0 | → | ○ |
| 1 | 1 | 1 | 0 | 1 | 1 | → | X |
| 1 | 0 | 0 | 1 | 0 | 1 | → | ○ |
| 1 | 0 | 1 | 1 | 0 | 1 | → | X |
| | | | | | | | 50% |

(D) TWO BITS ERROR DETECTION

| BIT i 1 BIT ERROR DETECTION | BIT j 1 BIT ERROR DETECTION | OCCURRENCE PROBABILITY | 1 BIT ERROR DETECTABLE OR UNDETECTABLE |
|---|---|---|---|
| X | X | 25% | X |
| X | ○ | 25% | ○ |
| ○ | X | 25% | ○ |
| ○ | ○ | 25% | X |
| | | | 25% + 25% = 50% |

"○" MEANS DETECTABLE

As shown in Table 1(C), a 1-bit error is detectable with a 50% probability, and as shown in Table 1(D), a two-bit error is detectable with a 50% probability under the precondition that the errors occur at bit positions separate from each other.

More specifically, with the second parity of the present embodiment, occurrence of a two-bit error can be detected with a certain probability by redundantly adding an AND operation to the parity bit calculation using an ordinary EOR operation. More specifically, when two of 1-bit errors occur at separate bit positions, that is, when a two-bit error occurs, one of the parity bits can detect a 1-bit error, whereas the other parity bit cannot detect an error. As a result, a two-bit error can be detected with a certain probability.

In place of an EOR operation, an exclusive-NOR (ENOR) operation can be used. More specifically, when a 1-bit parity is created by alternately performing an exclusive-NOR (ENOR) and a logical operation (Boolean operation) other than an EOR operation, the same effect can be obtained.

More specifically, the combination is as follows. (1) EOR and AND, (2) EOR and NAND, (3) EOR and OR, (4) EOR and NOR, (5) ENOR and AND, (6) ENOR and NAND, (7) ENOR and OR, and (8) ENOR and NOR.

As is already described, a parity bit of a well-known 1-bit CRC (CRC 1) is created by an EOR operation which is performed sequentially on 1-bit data configuring a data column. In contrast with this, the improved 1-bit parity which is created by alternately performing an EOR operation or an ENOR operation and a logical operation other than them on 1-bit data configuring a data column has only a 1-bit length, but has a high error detection ability.

More specifically, in the above description, an improved 1-bit parity is shown as one example of the auxiliary parity of LDPC, and the improved 1-bit parity can be widely applied to error detection schemes using parity bits which are well-known 1-bit CRCs (CRC 1).

In the present embodiment, operation multiplicity of bit data is 2 (1-bit data is inputted in EOR and AND), but the multiplicity can be an integer value which is 2 or larger, and the bit data subjected to operations do not have to be adjacent to each other.

Figure 11A:
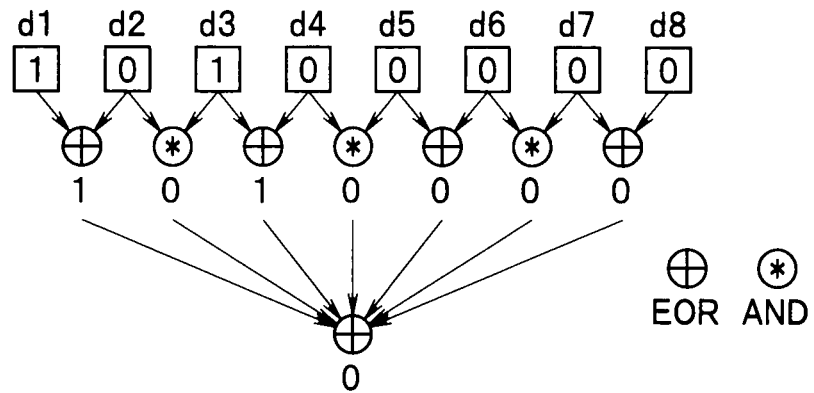
FIG. 11A and FIG. 11B are diagrams illustrating auxiliary parity bits of auxiliary check nodes in an error detection correction method according to a modified example of the third embodiment.
Figure 11B:
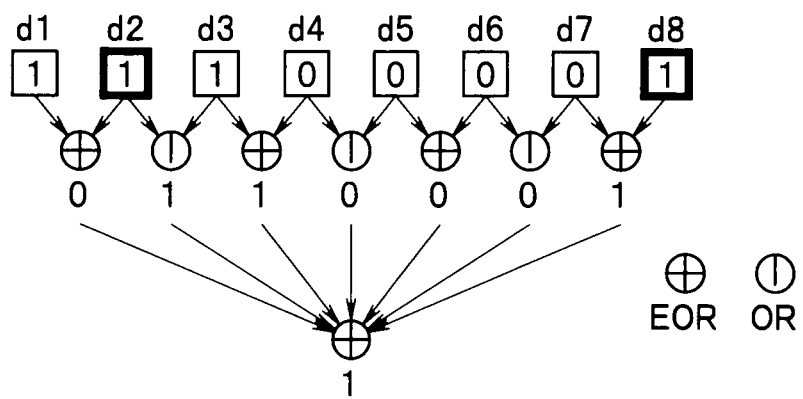

Furthermore, a modified example of the present embodiment which uses an auxiliary parity of two bits will be described using FIG. 11A and FIG. 11B. Here, m=8, and an EOR operation and an AND operation are executed among eight of bit data, and an odd-number parity of a result of this is set as an auxiliary parity 1, whereas an EOR operation and an OR operation are executed among eight of bit data, and an odd-number parity of a result of this is set as an auxiliary parity 2. The auxiliary parity 2 shown in FIG. 11B is placed to complement the auxiliary parity 1, and can detect an even-number error of two bits or more which the auxiliary parity 1 shown in FIG. 11A cannot detect.

Table 2 is for explaining the error detection probabilities by the auxiliary parities 1 and 2 according to the modified example of the present embodiment. Table 2(A)-1 shows the auxiliary parity 1 of transmission data. Table 2(A)-2 shows the auxiliary parity 2 of transmission data. Table 2(B)-1 shows the auxiliary parity 1 of reception data. Table 2(B)-2 shows the auxiliary parity 2 of reception data. Table 2 shows the case in which an error occurs to the reception data, that is, data differ from each other at the time of transmission and reception.

TABLE 2

(A) TRANSMISSION DATA
(A)-1: AUXILIARY PARITY 1

| d0 | d1 | d2 | a<br>EOR(d0, d1) | b<br>OR(d1, d2) | c<br>EOR(a, b) |
|---|---|---|---|---|---|
| 0 | 0 | 0 | 0 | 0 | 0 |
| 0 | 0 | 1 | 0 | 1 | 1 |
| 0 | 1 | 0 | 1 | 1 | 0 |
| 0 | 1 | 1 | 1 | 1 | 0 |
| 1 | 0 | 0 | 1 | 0 | 1 |
| 1 | 0 | 1 | 1 | 1 | 0 |
| 1 | 1 | 0 | 0 | 1 | 1 |
| 1 | 1 | 1 | 0 | 1 | 1 |

↓ (ERROR OCCURRENCE)

(A)-2: AUXILIARY PARITY 2

| d1 | d2 | d3 | a<br>EOR(d1, d2) | b<br>AND(d2, d3) | c<br>EOR(a, b) |
|---|---|---|---|---|---|
| 0 | 0 | 0 | 0 | 0 | 0 |
| 0 | 0 | 1 | 0 | 0 | 0 |
| 0 | 1 | 0 | 1 | 0 | 1 |
| 0 | 1 | 1 | 1 | 1 | 0 |
| 1 | 0 | 0 | 1 | 0 | 1 |
| 1 | 0 | 1 | 1 | 0 | 1 |
| 1 | 1 | 0 | 0 | 0 | 0 |
| 1 | 1 | 1 | 0 | 1 | 1 |

↓ (ERROR OCCURRENCE)

(B) RECEPTION DATA
(B)-1: AUXILIARY PARITY 1 — 1 BIT ERROR

| d0 | d1 | d2 | a<br>EOR(d0, d1) | b<br>OR(d1, d2) | c<br>EOR(a, b) | | DETECTABLE OR UNDETECTABLE |
|---|---|---|---|---|---|---|---|
| 0 | 1 | 0 | 1 | 1 | 0 | → | X |
| 0 | 1 | 1 | 1 | 1 | 0 | → | ○ |
| 0 | 0 | 0 | 0 | 0 | 0 | → | X |
| 0 | 0 | 1 | 0 | 1 | 1 | → | ○ |
| 1 | 1 | 0 | 0 | 1 | 1 | → | X |
| 1 | 1 | 1 | 0 | 1 | 1 | → | ○ |
| 1 | 0 | 0 | 1 | 0 | 1 | → | X |
| 1 | 0 | 1 | 1 | 1 | 0 | → | ○ |

50%

(B)-2: AUXILIARY PARITY 2 — 1 BIT ERROR

| d1 | d2 | d3 | a<br>EOR(d1, d2) | b<br>AND (d2, d3) | c<br>EOR(a, b) | | DETECTABLE OR UNDETECTABLE |
|---|---|---|---|---|---|---|---|
| 0 | 1 | 0 | 1 | 0 | 1 | → | ○ |
| 0 | 1 | 1 | 1 | 1 | 0 | → | X |
| 0 | 0 | 0 | 0 | 0 | 0 | → | ○ |
| 0 | 0 | 1 | 0 | 0 | 0 | → | X |
| 1 | 1 | 0 | 0 | 0 | 0 | → | ○ |
| 1 | 1 | 1 | 0 | 1 | 1 | → | X |
| 1 | 0 | 0 | 1 | 0 | 1 | → | ○ |
| 1 | 0 | 1 | 1 | 0 | 1 | → | X |

50%

"○" MEANS DETECTABLE

As shown in Table 2, in the error detection correction method according to the present modified example, the check node is checked by the auxiliary parity 1 and the auxiliary parity 2, and thereby, even-number errors of two bits or more can be detected with an about 100% probability. More specifically, the detection probabilities of the auxiliary parity 1 and the auxiliary parity 2 are respectively 50%, and the detection correction method is designed so that the respective detection results are in the complementing relation, whereby a 100% detection probability is realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An error detection correction method, comprising:
   performing decoding processing using a sum-product algorithm, which repeats processing of propagating a reliability α from a check node set to correspond to a Tanner graph of a check matrix of a low density parity check code to a plurality of bit nodes connected to the check node, and processing of propagating a reliability β from a bit node to a plurality of check nodes connected to the bit node, wherein the check node includes a parity of two bits or more.

2. The error detection correction method according to claim 1, wherein the check node includes an ordinary check node which performs checking by the parity bit, and an auxiliary check node which performs checking by a second parity differing from the parity bit.

3. The error detection correction method according to claim 2, comprising:

including an auxiliary check node with a second parity created for two or more ordinary check nodes as one unit.

4. The error detection correction method according to claim 2, comprising:

creating the second parity as a 1-bit parity by alternately performing an exclusive OR operation or an exclusive NOR operation, and a logical operation other than the exclusive OR operation or the exclusive NOR operation on a plurality of 1-bit data configuring a data column.

5. The error detection correction method according to claim 4, wherein the logical operation is any of an AND operation, a NAND operation, an OR operation and a NOR operation.

6. The error detection correction method according to claim 3, comprising:

creating the second parity as a 1-bit parity by alternately performing an exclusive OR operation or an exclusive NOR operation, and a logical operation other than the exclusive OR operation or the exclusive NOR operation on a plurality of 1-bit data configuring a data column.

7. The error detection correction method according to claim 6, wherein the logical operation is any of an AND operation, a NAND operation, an OR operation and a NOR operation.

8. The error detection correction method according to claim 1, comprising:

creating a 1-bit second parity different from the parity by alternately performing an exclusive OR operation or an exclusive NOR operation, and a logical operation other than the exclusive OR operation or the exclusive NOR operation on a plurality of 1-bit data configuring a data column.

9. The error detection correction method according to claim 8, wherein the logical operation is any of an AND operation, a NAND operation, an OR operation and a NOR operation.

10. A semiconductor memory apparatus, comprising:

a semiconductor memory section; and a memory controller configured to perform error detection correction processing with a check node including a parity of two bits or more, in decoding processing using a sum-product algorithm, repeating processing of propagating a reliability α from the check node set to correspond to a Tanner graph of a check matrix of a low density parity check code to a plurality of bit nodes connected to the check node, and processing of propagating a reliability β from a bit node to a plurality of check nodes connected to the bit node.

11. The semiconductor memory apparatus according to claim 10, wherein as the check node, an ordinary check node which performs checking by the parity bit, and an auxiliary check node which performs checking by a second parity differing from the parity bit are included.

12. The semiconductor memory apparatus according to claim 11, wherein the auxiliary check node with the second parity created for two or more ordinary check nodes as one unit is included.

13. The semiconductor memory apparatus according to claim 11, wherein the second parity is a 1-bit parity created by alternately performing an exclusive OR operation or an exclusive NOR operation, and a logical operation other than the exclusive OR operation or the exclusive NOR operation on a plurality of 1-bit data configuring a data column.

14. The semiconductor memory apparatus according to claim 13, wherein the logical operation is any of an AND operation, a NAND operation, an OR operation and a NOR operation.

15. The semiconductor memory apparatus according to claim 12, wherein the second parity is a 1-bit parity created by alternately performing an exclusive OR operation or an exclusive NOR operation, and a logical operation other than the exclusive OR operation or the exclusive NOR operation on a plurality of 1-bit data configuring a data column.

16. The semiconductor memory apparatus according to claim 15, wherein the logical operation is any of an AND operation, a NAND operation, an OR operation and a NOR operation.

* * * * *